(12) United States Patent
Yamamoto

(10) Patent No.: US 6,919,284 B2
(45) Date of Patent: Jul. 19, 2005

(54) PROTECTIVE TAPE APPLYING METHOD AND APPARATUS, AND PROTECTIVE TAPE SEPARATING METHOD

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/327,880

(22) Filed: Dec. 26, 2002

(65) Prior Publication Data

US 2003/0131929 A1 Jul. 17, 2003

(30) Foreign Application Priority Data

Jan. 15, 2002 (JP) ........................................ 2002-006013

(51) Int. Cl.⁷ .............................................. H01L 21/44
(52) U.S. Cl. ...................... 438/780; 438/459; 438/464; 438/689; 438/692
(58) Field of Search ........................... 438/33, 113, 780, 438/974, 976–97, 950

(56) References Cited

U.S. PATENT DOCUMENTS

| 5,476,566 | A | * | 12/1995 | Cavasin ................... 156/249 |
| 5,480,842 | A | * | 1/1996 | Clifton et al. ............. 438/464 |
| 5,840,614 | A | * | 11/1998 | Sim et al. ................. 438/464 |
| 6,337,257 | B1 | * | 1/2002 | Toyosawa .................. 438/459 |
| 6,504,241 | B1 | * | 1/2003 | Yanagida ................... 257/686 |
| 6,520,844 | B2 | * | 2/2003 | Iwasaki et al. ............. 451/285 |
| 6,638,389 | B2 | * | 10/2003 | Kassir et al. ............... 156/286 |
| 6,673,654 | B2 | * | 1/2004 | Ohno et al. ................ 438/118 |
| 6,702,652 | B2 | * | 3/2004 | Arai ........................... 451/41 |
| 2003/0005810 | A1 | * | 1/2003 | Grigg et al. ............... 438/692 |
| 2003/0064592 | A1 | * | 4/2003 | Yamamoto ................. 438/689 |
| 2003/0073264 | A1 | * | 4/2003 | Meguro et al. ............ 438/113 |
| 2003/0082915 | A1 | * | 5/2003 | Iwasaki et al. ............. 438/690 |
| 2003/0121599 | A1 | * | 7/2003 | Yamamoto ................. 156/247 |
| 2003/0134578 | A1 | * | 7/2003 | Strasbaugh et al. .......... 451/41 |
| 2004/0038469 | A1 | * | 2/2004 | Yamamoto ................. 438/200 |

FOREIGN PATENT DOCUMENTS

| JP | 11074231 A | * | 3/1999 | ......... H01L/21/301 |
| JP | 2000-331968 | * | 11/2000 | ......... H01L/21/304 |

* cited by examiner

Primary Examiner—Matthew Smith
Assistant Examiner—B. V. Keshavan
(74) Attorney, Agent, or Firm—Rader, Fishman & Grauer PLLC (57) ABSTRACT

A protective tape is applied to a surface of a wafer supported by a chuck table. A blade tip of a cutter unit is inserted into a groove formed in the chuck table circumferentially of the wafer, to cut the protective tape to have a larger diameter than the wafer. The wafer with the protective tape applied thereto undergoes a back grinding process. Subsequently, in a separating step, the protective tape is separated by means of a separating tape applied to the surface of protective tape.

5 Claims, 8 Drawing Sheets

PROTECTIVE TAPE APPLYING METHOD AND APPARATUS, AND PROTECTIVE TAPE SEPARATING METHOD

BACKGROUND OF THE INVENTION (1) Field of the Invention

This invention relates to a technique for applying protective tape to a wafer surface with a pattern formed thereon and for separating the protective tape.

(2) Description of the Related Art

In a conventional process of manufacturing semiconductor wafers, a mechanical method such as grinding or polishing, or a chemical method including etching, is used to process the back surfaces of semiconductor wafers (hereinafter simply called "wafers") to reduce the thickness thereof. When these methods are used to process the wafers, a protective tape is applied to the front surfaces of wafers in order to protect the front surfaces having wiring patterns formed thereon.

When a wafer is sent to a back-grinding process, the front surface (patterned surface) is suction-supported by a chuck table and the back surface is ground with a grinder. At this time, a protective tape is applied to the front surface to avoid the pattern being damaged under the stress of grinding occurring to the front surface, and to avoid contamination of the pattern.

Figure 1:
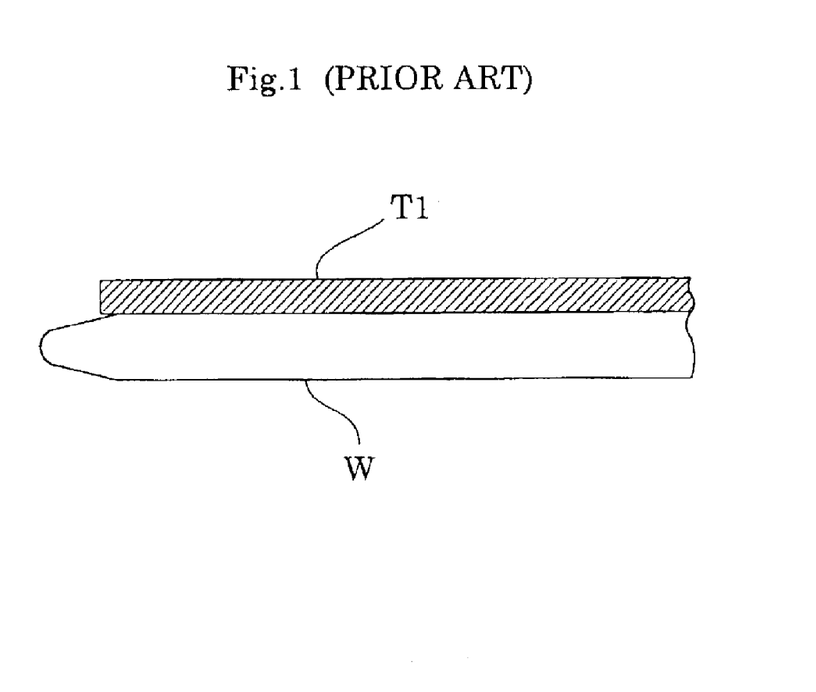
FIG. 1 is an enlarged fragmentary view showing a wafer with protective tape applied thereto before a back grinding process.

The size of the protective tape applied to the surface of the wafer is, as shown in FIG. 1, smaller than the diameter of the semiconductor wafer. This is done to avoid a situation where, in time of a back grinding process, for example, protruding portions of the protective tape flutter and damage edges of the wafer.

The protective tape applied to the surface of the wafer in this way is separated in a separating step following the back grinding process.

However, the semiconductor wafer with the protective tape applied thereto and having undergone a back grinding process presents the following inconvenience.

Figure 2:
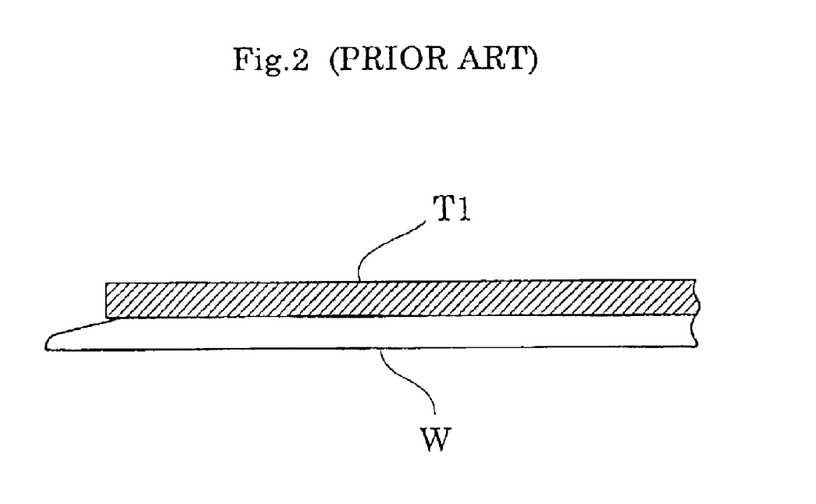
FIG. 2 is an enlarged fragmentary view showing the wafer with protective tape applied thereto, a state after the back grinding process.

As shown in FIG. 2, the semiconductor wafer formed thin by the back grinding process has sharp edges projecting from the portion covered by the protective tape. Thus, when the wafer is stored in a cassette, the edges stick into inner walls of the cassette. When the wafer is taken out of the cassette in such a state, the edges of the wafer may be broken, or a fetching error may be caused.

SUMMARY OF THE INVENTION

This invention has been made having regard to the state of the art noted above, and its primary object is to provide a protective tape applying method and apparatus and a protective tape separating method for applying protective tape in a way to facilitate handling of semiconductor wafers, and for efficiently separating the protective tape applied.

Recently, the market of semiconductor wafers, along with high density mounting, has been tending toward reduced wafer thickness. That is, the edges of wafers have become sharp. In the conventional protective tape applying method (method of applying, to the surface of a wafer, protective tape smaller in diameter than the wafer), therefore, the edges of the wafer stick into the inner walls of a cassette to be broken, which makes handling difficult. Inventor has made intensive research for a method convenient to handling of wafers, and took notice of the size of protective tape.

In the conventional method, when a protective tape of larger diameter than a semiconductor wafer is applied to the surface of the wafer and a back grinding process is carried out, protruding portions of the protective tape could flutter and damage the edges of the wafer. It is, therefore, common sense in this industry to apply to the surface of the wafer a protective tape smaller in diameter than the wafer before a back grinding process.

However, Inventor has carried out experiment to perform a back grinding process on wafers with a protective tape of larger diameter applied to the surfaces of the wafers, and attained a finding that the protective tape, even if protruding from the wafers, does not damage the edges of the wafers.

The above object is fulfilled, according to this invention, by a protective tape applying method for applying protective tape to a surface of a semiconductor wafer with a pattern formed thereon, comprising a step of applying a protective tape of larger diameter than the semiconductor wafer to the surface of the semiconductor wafer.

In the protective tape applying method according to this invention, a protective tape of larger diameter than the semiconductor wafer is applied to the surface of the semiconductor wafer. Consequently, the edges of the semiconductor wafer are prevented from directly contacting other objects.

Preferably, the protective tape is larger in diameter than the semiconductor wafer before a thinning process. It is still more desirable to apply a plurality of protective tapes in plies to the surface of the semiconductor wafer. The protective tapes may be applied in plies by repeating an operation to cut each protective tape in sheet form approximately to a shape of the semiconductor wafer, and apply the tape to the semiconductor wafer. The protective tapes applied in plies may be in form of labels cut approximately to a shape of the semiconductor wafer in advance. Where the protective tapes in sheet form are cut and applied in plies, for example, one of the protective tapes applied first may have a smaller diameter than the semiconductor wafer before the thinning process, and a second one of the protective tapes may have a larger diameter than the semiconductor wafer before the thinning process. Alternatively, the protective tapes may be equal in diameter and larger than the semiconductor wafer before the thinning process. Where the protective tapes applied are in form of labels cut approximately to the shape of the semiconductor wafer in advance, one of the protective tapes in form of labels applied first may have a smaller diameter than the semiconductor wafer before the thinning process, and a second one of the protective tapes may have a larger diameter than the semiconductor wafer before the thinning process. One of the protective tapes in form of labels applied first may have a larger diameter than the semiconductor wafer before the thinning process, and a second one of the protective tapes may have a smaller diameter than the semiconductor wafer before the thinning process. The protective tapes in form of labels may be equal in diameter and larger than the semiconductor wafer before the thinning process. It is preferable that the protective tapes larger in diameter than the semiconductor wafer before the thinning process protrude from edges of the semiconductor wafer by a length within 2 mm.

By applying, to the semiconductor wafer, the protective tape larger in diameter than the semiconductor wafer before the thinning process, the edges of the semiconductor wafer are prevented from directly contacting other objects. This facilitates handling of the semiconductor wafer formed thin, to realize improvement in operating efficiency. The protective tapes applied in plies give rigidity to the semiconductor wafer to facilitate its handling still further.

The foregoing object is fulfilled, according to another aspect of the invention, by a protective tape applying apparatus for applying protective tape to a surface of a semiconductor wafer with a pattern formed thereon, the apparatus comprising:

a support device for receiving and supporting the semiconductor wafer;

a tape feed device for feeding the protective tape toward the semiconductor wafer supported;

an applying device for applying the protective tape fed to the surface of the semiconductor wafer;

a cutter unit for cutting the protective tape applied to the surface of the semiconductor wafer, to a size of larger diameter than the semiconductor wafer;

a separating device for separating unwanted tape of the protective tape cut; and a collector for collecting the unwanted tape separated.

With the protective tape applying apparatus according to this invention, a protective tape is applied to the surface of the semiconductor wafer supported by the support device. This protective tape is cut by the cutter unit to a size of larger diameter than the semiconductor wafer. The protective tape protruding from the semiconductor wafer acts as buffer to prevent the edges of the semiconductor wafer from sticking to inner walls of a cassette. This protects the edges of the semiconductor wafer from damage, and facilitates handling of the semiconductor wafer to realize improvement in operating efficiency.

Preferably, the support device has a peripheral portion thereof level with the semiconductor wafer placed on the support device, the protective tape being applied over the peripheral portion and the semiconductor wafer.

Since the protective tape is applied over the peripheral portion of the support device and the semiconductor wafer, the protective tape is exposed over a reduced distance. Thus, the protective tape is deflected by a reduced degree in time of cutting the protective tape, thereby improving the accuracy of cutting the protective tape.

The foregoing object is fulfilled, according to a further aspect of the invention, by a separating method for separating the protective tape applied to the surface of the semiconductor wafer by the above protective tape applying method, comprising a step of applying a separating tape over the protective tape applied to the surface of said semiconductor wafer, and separating the protective tape from the surface of the semiconductor wafer by means of said separating tape.

In the protective tape separating method according to this invention, the separating tape is applied to the surface of the protective tape protruding from the diameter of the semiconductor wafer. By separating this separating tape, the protective tape is separated together. That is, a protruding portion of the protective tape is folded back to facilitate separation of the protective tape.

This specification discloses the following solutions also:

(1) A semiconductor wafer storing method for storing semiconductor wafers in a cassette, comprising a step of storing, in the cassette, the semiconductor wafers with a protective tape of larger diameter than the semiconductor wafers applied to the surfaces.

In the course of manufacturing semiconductor wafers, the back surface of each semiconductor wafer is processed to reduce its thickness by using a mechanical method such as grinding method or polishing method, or a chemical method such as etching. At this time, a protective tape is applied to protect a pattern formed on the surface of the semiconductor wafer (hereinafter called "wafer" for short). This protective tape is smaller in diameter than the wafer.

However, since the edges of the wafer formed thin are sharp, when stored as it is in the cassette, the edges of the wafer could stick into inner walls of the cassette. When the wafer in such a state is taken out of the cassette, the wafer may be broken, or a fetching error may be caused.

According to the invention (1) above, the semiconductor wafers with the protective tape of larger diameter than the semiconductor wafers applied to the surfaces are stored in the cassette. The portions of the protective tape protruding from the wafers act as buffer to prevent the edges of the wafers from sticking to the inner walls of the cassette.

(2) A protective tape applying method for applying protective tape to a surface of a semiconductor wafer with a pattern formed thereon, comprising:

a supporting step for supporting the semiconductor wafer on support means;

a tape feeding step for feeding the protective tape toward the semiconductor wafer supported;

an applying step for applying the protective tape from the tape feeding step over peripheral areas of the support means and the surface of the semiconductor wafer;

a cutting step for cutting the protective tape applied along an outer edge thereof with a cutter unit;

a separating step for separating unwanted tape left after the protective tape is cut; and a collecting step for collecting the unwanted tape separated.

When the semiconductor wafer is thinned by back grinding, for example, a protective tape is applied beforehand in order to protect the pattern on the surface of the semiconductor wafer from contamination and damage. In the step of applying the protective tape, the protective tape is cut with tension applied thereto by gripping the protective tape with a gripper roller or the like disposed in a tape feeding direction, in order that the protective tape may be applied uniformly over the surface of the wafer.

However, even when tension is applied to the protective tape by the gripper roller, a blade tip of the cutter unit applies a pressure to an exposed portion of the protective tape in time of cutting the protective tape, to deflect the protective tape by a large degree, if the gripper roller is at a long distance from an end of the wafer (protective tape exposing distance). This results in a difficulty in cutting the protective tape.

According to the invention (2) above, the protective tape is applied over peripheral areas of the support means and the semiconductor wafer, to reduce the protective tape exposing distance. Thus, the protective tape is deflected by a reduced degree in time of cutting the protective tape, thereby improving the accuracy of cutting the protective tape.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

Protective Tape Applying Method

A tape applying apparatus for executing a protective tape applying method according to this invention will be described first with reference to the drawings.

Figure 3:
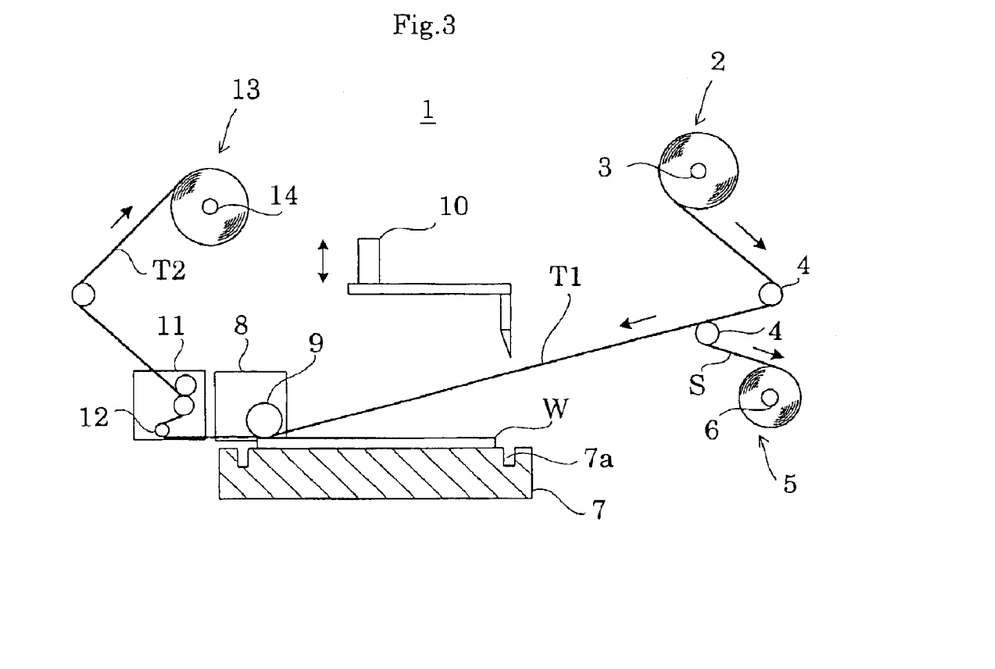
FIG. 3 is a view, partly in section, showing an outline of a tape applying apparatus according to this invention.
Figure 4:
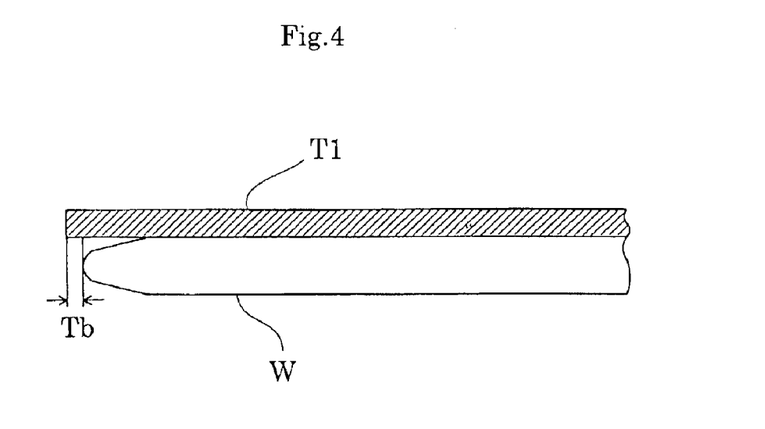
FIG. 4 is an enlarged fragmentary view showing a wafer with a protective tape applied thereto before a back grinding process.
Figure 5:
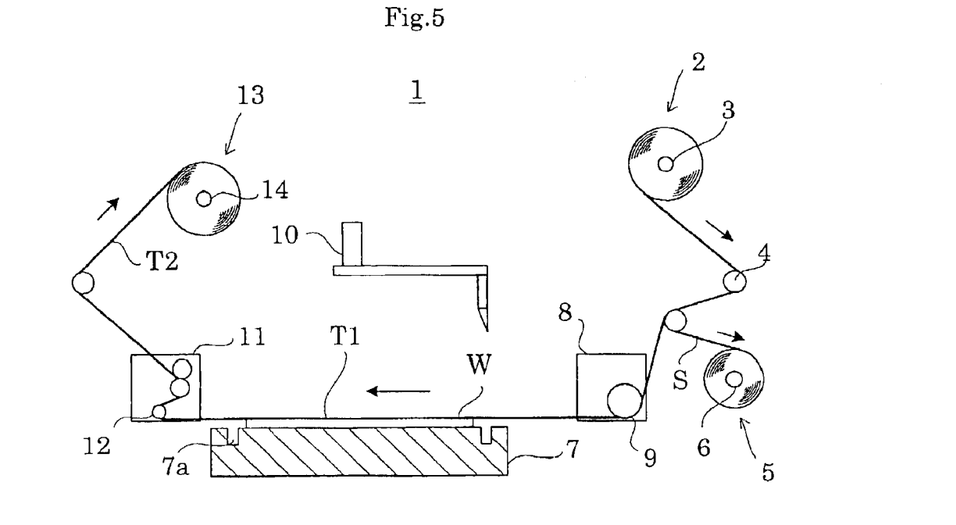
FIG. 5 is a schematic front view illustrating a tape applying process.
Figure 6:
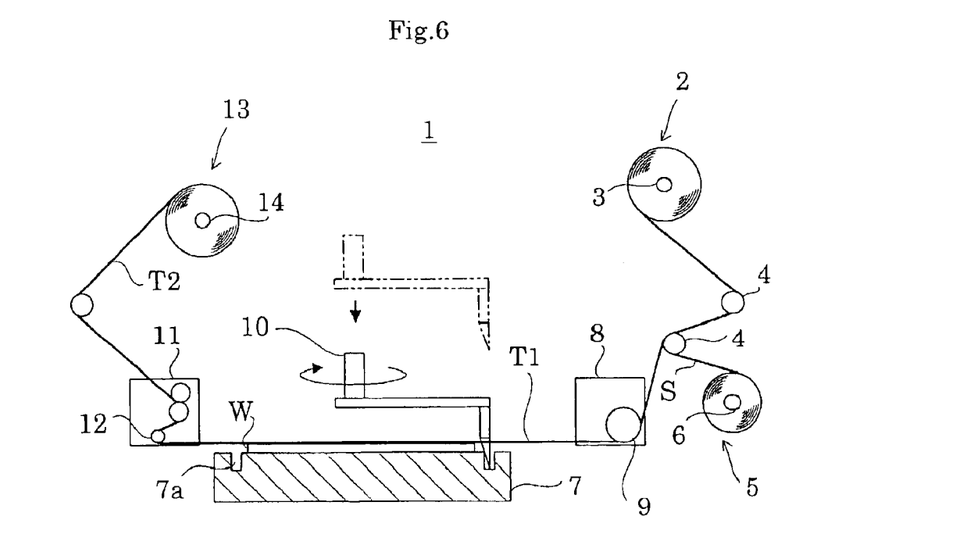
FIG. 6 is a schematic front view illustrating the tape applying process.
Figure 7:
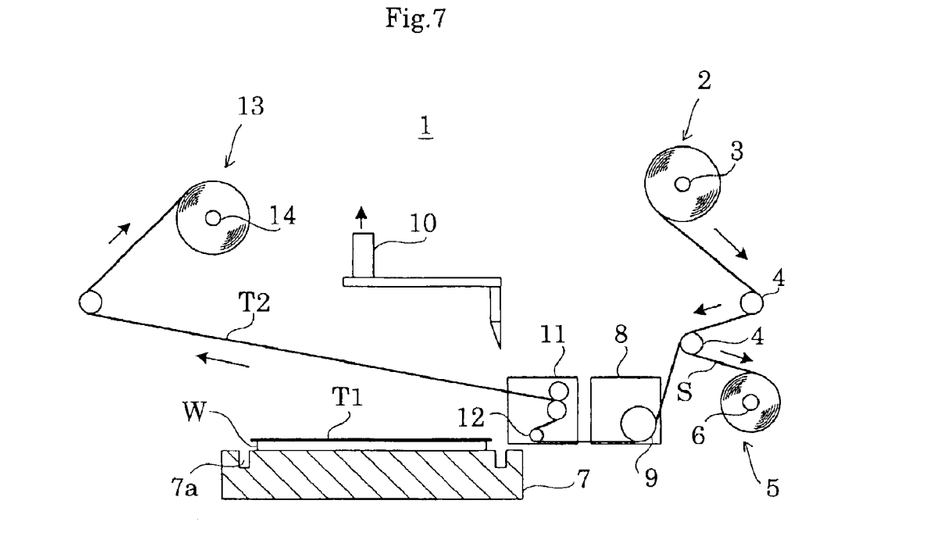
FIG. 7 is a schematic front view illustrating the tape applying process.

FIG. 3 is a view, partly in section, showing an outline of a tape applying apparatus, FIG. 4 is an enlarged fragmentary view showing a wafer with a protective tape applied thereto before a back grinding process, and FIGS. 5 through 7 are front views illustrating a protective tape applying process.

An apparatus 1 for applying protective tape to semiconductor wafers, in this embodiment, has a tape server 2 for supplying protective tape T1 along with a separator S, a separator collector 5 for separating and collecting the separator S from the protective tape T1, a chuck table 7 for suction-supporting a semiconductor wafer W (hereinafter simply called "wafer W") thereon, a tape applying mechanism 8 for pressing and applying the protective tape T1 to the wafer W, a cutter unit 10 for cutting the protective tape T1 on the wafer W along the circumference of the wafer W, a tape separating mechanism 11 for separating unwanted tape T2 from the wafer W, and a tape collector 13 for collecting the separated tape.

The construction of each mechanism will be described in detail hereinafter.

The tape server 2 guides the protective tape T1 with separator S drawn from a tape bobbin 3 to move around a group of guide rollers 4 in a winding manner. The tape bobbin 3 is supported by a vertical wall, not shown, and is checked against rotation by a braking mechanism or the like.

The separator collector 5 has a collecting bobbin 6 supported by the vertical wall not shown, and is operatively connected to a driving device such as a motor.

The chuck table 7 has guide pins for adjusting position of the wafer W placed thereon with reference to an orientation flat, while suction-supporting the wafer at the back surface thereof. A groove 7a is formed circumferentially of an area for suction-supporting the wafer W, to receive a blade tip of cutter unit 10.

The tape applying mechanism 8 has a frame thereof held by a rail of a main body of the apparatus and operatively connected to a driving device such as a motor not shown, to be slidable in a tape running direction. The frame rotatably supports an applicator roller 9 which is vertically swung by a cylinder or the like not shown. Thus, the applicator roller 9 applies the protective tape T1 to the surface of the wafer W while pressing and rolling on the surface of the protective tape T1.

The cutter unit 10 is vertically movable by a lift mechanism, not shown, between a standby position and a cutting position for cutting the protective tape T1. The blade tip is inserted into the groove 7a formed in the chuck table 7, to cut the protective tape T1 along the groove 7a.

The tape separating mechanism 11 has a frame thereof held by the rail of the main body of the apparatus and operatively connected to a driving device such as a motor not shown, to be slidable in the tape running direction. The frame rotatably supports a separator roller 12 which is vertically swung by a cylinder or the like not shown. The separator roller 12 is provided to separate from the wafer W the unwanted tape T2 which is left thereon after the tape is cut along the circumference of the wafer W.

The tape collector 13 has a collecting bobbin 14 supported by the vertical wall not shown, and is operatively connected to a driving device such as a motor. That is, a predetermined quantity of protective tape T1 is drawn from the tape server 2 and fed over the wafer W. The collecting bobbin 14 is driven by the driving device to wind up the unwanted tape T2 left after a cutting operation.

A method of applying a protective tape of larger diameter than the wafer to the surface of wafer W will be described with reference to the drawings, using the tape applying apparatus having the above construction.

This embodiment uses a protective tape whose modulus in tension indicating hardness is 500 MPa at normal temperature (23° C.). The hardness of the protective tape, preferably, is from 50 MPa to 5000 MPa. The conditions of measuring the modulus in tension of this protective tape are samples of 1 cm$^2$ and the rate of pulling at 50 mm/min.

As shown in the enlarged view of an end of wafer W in FIG. 4, the length of a portion Tb of protective tape T1 protruding from an edge of wafer W is as follows.

The length of protruding portion Tb before a back grinding process is 2.0 mm or less, and the length of protruding portion Tb' after the back grinding process is 2.0 mm+α (e.g. α=0.5 mm). The value of α is varied as appropriate according to a shape resulting from beveling of the end of wafer W and a thickness of wafer W after grinding. The length of protruding portion Tb, preferably, is 1.0 mm or less before the back grinding process.

Where the length of protruding portion Tb before the back grinding process is 2.0 mm or less, and the length of protruding portion Tb' after the back grinding process is 2.0 mm+α, the lengths of protective tape T1 protruding from the wafer W before and after the back grinding process are secured properly. As a result, the edges of wafer W may be prevented from directly contacting other objects during transport of wafer W.

Where the length of protruding portion Tb is 2.0 mm or more, the protruding portion flutters in time of back grinding of wafer W, thereby hampering uniform grinding.

The protective tape applying method will be described hereinafter.

First, the protective tape T1 is set on the tape bobbin 3 of the tape applying apparatus.

A wafer W is placed on, positionally adjusted to and suction-supported by the chuck table 7 of the tape applying apparatus. At this point, as shown in FIG. 3, the tape applying mechanism 8 and tape separating mechanism 11 are in an initial position at the left side, and the cutter unit 10 in the upper standby position.

After the position of the wafer W is adjusted, as shown in FIG. 5, the applicator roller 9 of the tape applying mechanism 8 is swung downward. Then the applicator roller 9 rolls in a direction opposite to the tape running direction (from left to right in FIG. 5) while pressing down the protective tape T1. In this way, the protective tape T1 is applied uniformly over the surface of the wafer W. When the tape applying mechanism 8 reaches a terminal position, the applicator roller 9 is raised.

Next, as shown in FIG. 6, the cutter unit 10 is lowered to the cutting position, and the blade tip pierces through the protective tape T1. The blade tip penetrating the protective tape T1 moves along the groove 7a formed in the chuck table 7. That is, the protective tape T1 is cut approximately to the shape of wafer W, with the protective tape T1 having a larger diameter than the wafer W and protruding from the wafer W. At this time, the tape applying mechanism 8 and tape separating mechanism 11 apply tension to the protective tape T1.

After cutting out the protective tape T1, the cutter unit 10 is raised back to the standby position as shown in FIG. 7.

Next, as shown in FIG. 7, the tape separating mechanism 11 takes up and separates the unwanted tape T2 left on the wafer W while moving over the wafer W in the direction opposite to the tape running direction.

When the tape separating mechanism 11 reaches a terminal position for the separating operation, the tape separating mechanism 11 and the tape applying mechanism 8 are moved in the tape running direction back to the initial position shown in FIG. 3. In the meantime, the unwanted tape T2 is rolled up by the collecting bobbin 14, while a predetermined quantity of protective tape T1 is drawn from the tape server 2. This ends the operation for applying the protective tape T1 to the surface of the wafer W in the tape applying apparatus.

Figure 8:
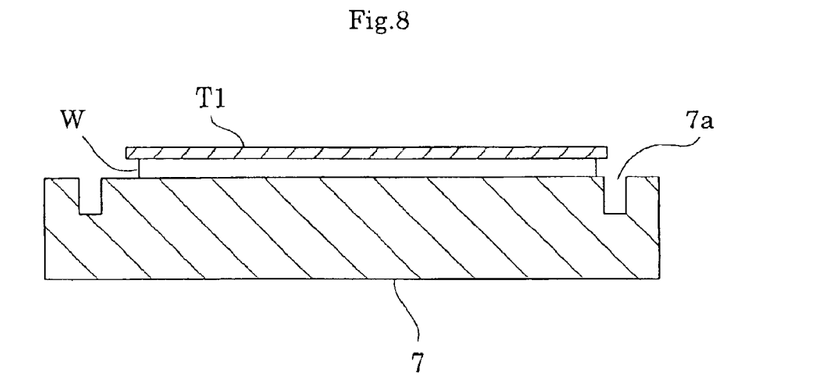
FIG. 8 is a sectional view showing a wafer with a protective tape applied thereto.

The wafer W with the protective tape T1 applied thereto has the protective tape T1 protruding from edges thereof as shown in FIGS. 4 and 8.

Figure 9:
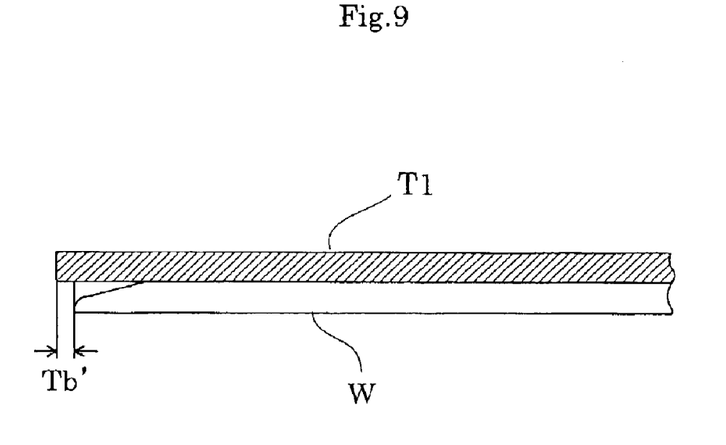
FIG. 9 is an enlarged fragmentary view showing a wafer with a protective tape applied thereto after a back grinding process.

Next, the wafer W with the protective tape T1 applied thereto is formed thin in a back grinding process. As shown in FIG. 9, the processed wafer W has the protective tape T1 applied to the surface and protruding from edges thereof.

Wafers W having undergone the back grinding process are transported in a cassette to a wafer mounting apparatus, for example. When each wafer W is lodged in the cassette, the protective tape T1 protruding from the wafer W acts as buffer to prevent the edges of wafer W from sticking to inner walls of the cassette.

When the cassette is loaded into the wafer mounting apparatus, the wafers W are taken out of the cassette, one at a time, and transferred to an alignment stage by a robot arm.

Each wafer W transferred to the alignment stage is aligned based on an orientation flat or the like.

Figure 10:
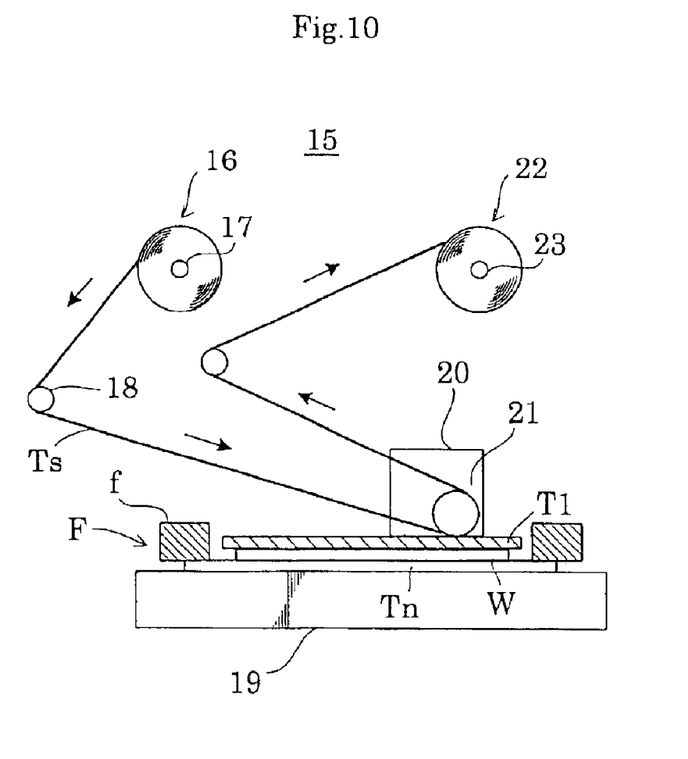
FIG. 10 is a front view showing an outline of a tape separating apparatus.

After the alignment, the wafer W is transported to a mount frame preparing unit, to be supported in a state when the wafer W is placed for a separating step shown in FIG. 10, i.e. by a ring-shaped frame f by means of adhesive tape Tn applied to the back surface. The wafer W supported by the ring-shaped frame f (hereinafter simply called "mount frame F") is transported to the separating step and is placed on a chuck table 19 of FIG. 10 to be described hereinafter.

A protective tape separating method will be described next.

A protective tape separating apparatus for executing the protective tape separating method in this embodiment will be described first with reference to the drawings.

Figure 11:
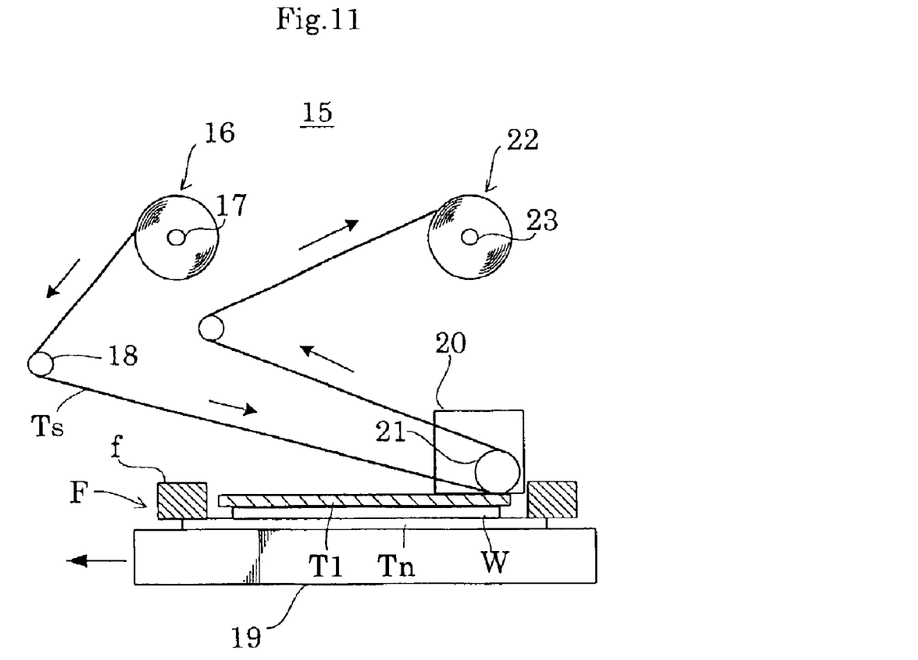
FIG. 11 is a schematic front view illustrating a tape separating process.
Figure 12:
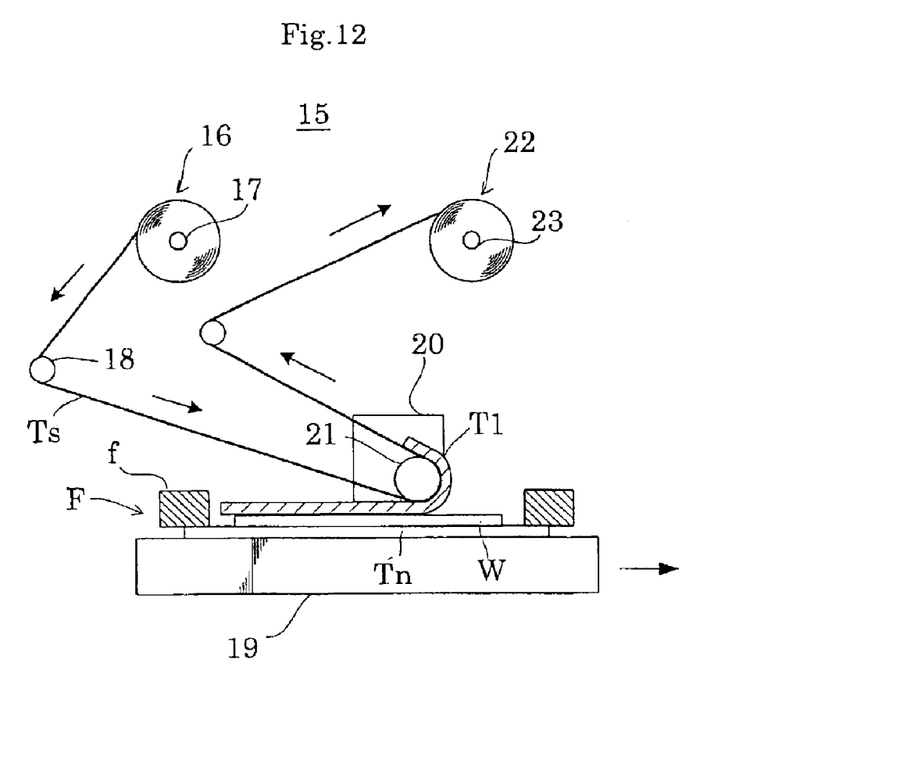
FIG. 12 is a schematic front view illustrating the tape separating process.
Figure 13:
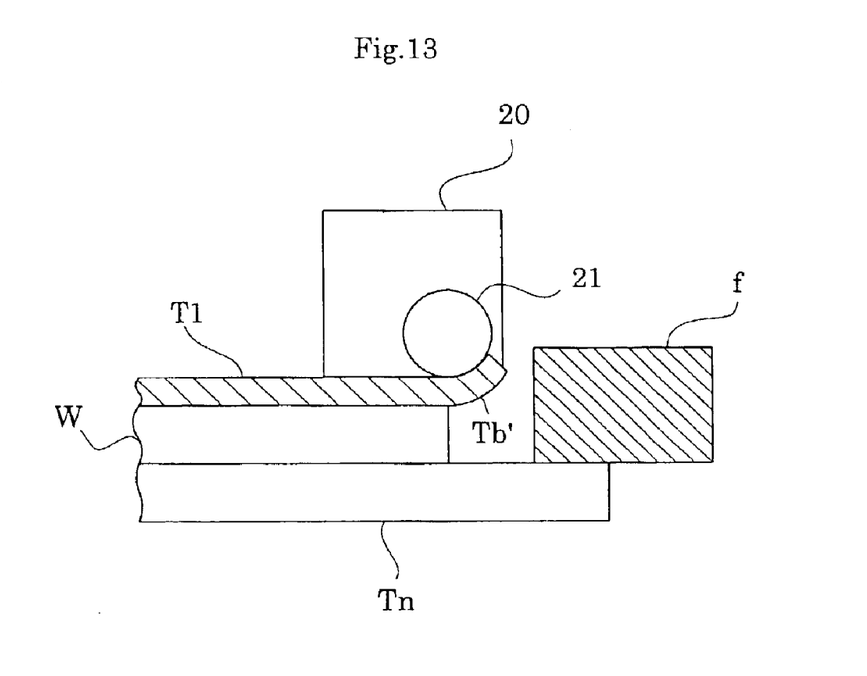
FIG. 13 is an enlarged fragmentary view showing a protective tape separating operation.
Figure 14:
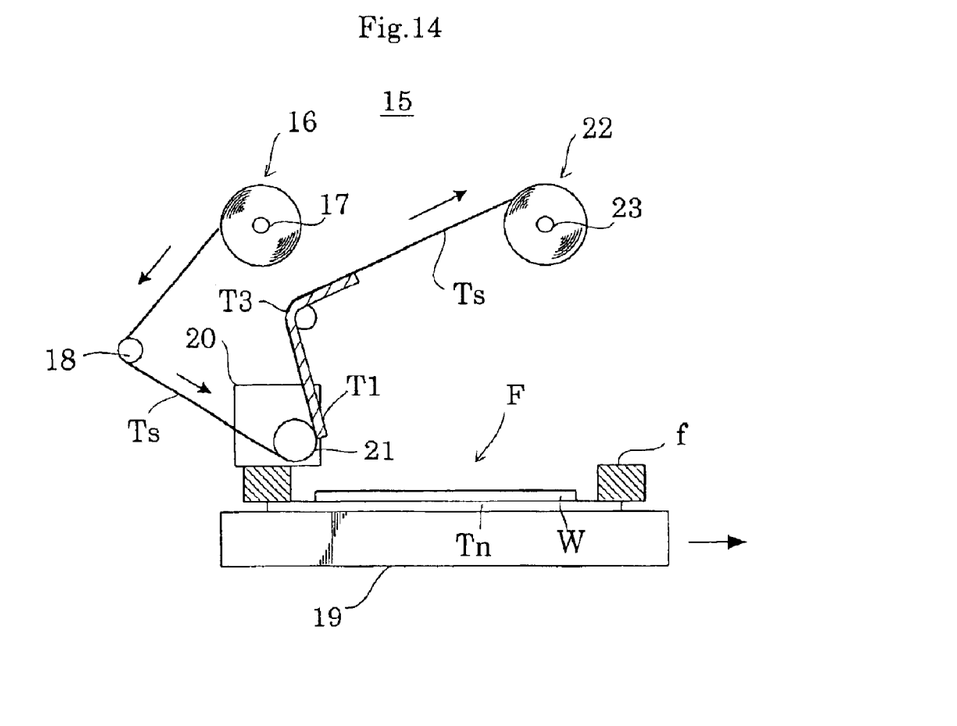
FIG. 14 is a schematic front view illustrating the tape separating process.

FIG. 10 is a front view showing an outline of the tape separating apparatus. FIGS. 11, 12 and 14 are explanatory views illustrating a protective tape separating process. FIG. 13 is an enlarged fragmentary view showing a protective tape separating operation.

An apparatus 15 for separating protective tape from semiconductor wafers, in this embodiment, has a tape server 16 for supplying a separating tape Ts, a chuck table 19 for suction-supporting the mount frame F, a separating mechanism 20 for pressing and applying the separating tape Ts to the protective tape T1 applied over the surface of the wafer W and separating the separating tape Ts together with the protective tape T1, and a tape collector 22 for collecting both tapes T1 and Ts separated from the wafer W.

The construction of each mechanism will be described in detail hereinafter.

The tape server 16 guides the separating tape Ts drawn from a tape bobbin 17 to the separating mechanism 20 by way of a guide roller 18. The tape bobbin 17 is supported by a vertical wall not shown.

The chuck table 19 has guide pins for adjusting position of the mount frame F transferred thereto. The chuck table 19 is constructed to suck the back surface of the mount frame F. Further, the chuck table 19 has a frame thereof held by a rail of a main body of the apparatus and operatively connected to a driving device not shown, to be slidable in a running direction of the separating tape Ts.

The separating mechanism 20 has a separator roller 21 rotatably supported by a frame thereof and vertically swung by a cylinder or the like not shown. The separator roller 21 is operable to press and apply the separating tape Ts to the surface of the protective tape T1.

The tape collector 22 has a collecting bobbin 23 supported by the vertical wall not shown, and operatively connected to a driving device such as a motor not shown. That is, a predetermined quantity of separating tape Ts is drawn from the tape server 16 and fed onto the wafer W. The collecting bobbin 23 is driven by the driving device to wind up the separating tape Ts joined with the protective tape T1.

A method of separating the protective tape applied in a plurality of plies to the surface of each wafer will be described with reference to the drawings, using the tape separating apparatus having the above construction.

As shown in FIG. 10, for example, a semiconductor wafer W having the protective tape applied thereto, and the ring-shaped frame f, are joined at the back surfaces by the adhesive tape Tn to form the mount frame F. This mount frame F is placed on the chuck table 19.

The mount frame F placed is positionally adjusted and suction-supported. Then, as shown in FIG. 11, the chuck table 19 is moved (leftward in FIG. 11) to a position having the separator roller 21 in contact with a peripheral portion of the wafer W.

After the position of the mount frame F is adjusted, as shown in FIG. 12, the separator roller 21 is swung down and the chuck table 19 is moved in the running direction of the separating tape Ts. With the movement of the chuck table 19, the separator roller 21 rolls over the wafer W pressing the separating tape Ts thereon. That is, the separating tape Ts is applied to the protective tape T1, and the protective tape T1 with the separating tape Ts adhering thereto is taken up and separated together with the separating tape Ts.

At start of the protective tape separation, the protective tape T1 protrudes from the wafer W. Thus, when the separator roller 21 begins to roll over the wafer W pressing the separating tape Ts thereon, as shown in FIG. 13, the protruding portion Tb' is folded back to provide a starting point for the protective tape separation.

When the chuck table 19 reaches a terminal position, as shown in FIG. 14, the separator roller 21 is moved upward and the chuck table 19 is moved counter to the tape running direction back to the initial position. In the meantime, the protective tape T1, which is joined and separated with the separating tape Ts, is wound up around the collecting bobbin 23, while a predetermined quantity of separating tape Ts is drawn from the tape server 16. This ends the operation for separating the protective tape T1 applied to the surface of the wafer W.

As described above, when the separation of protective tape T1 is started, the protective tape portion Tb protruding from the wafer W is folded back to provide a starting point. This allows the protective tape T1 to be separated efficiently.

This invention is not limited to the foregoing embodiment, but may be modified as follows:

(1) In the above protective tape applying method, one protective tape T1 is applied to the wafer W. Instead, a plurality of protective tapes may be applied. Protective tapes may be applied as follows, for example.

Figure 15:
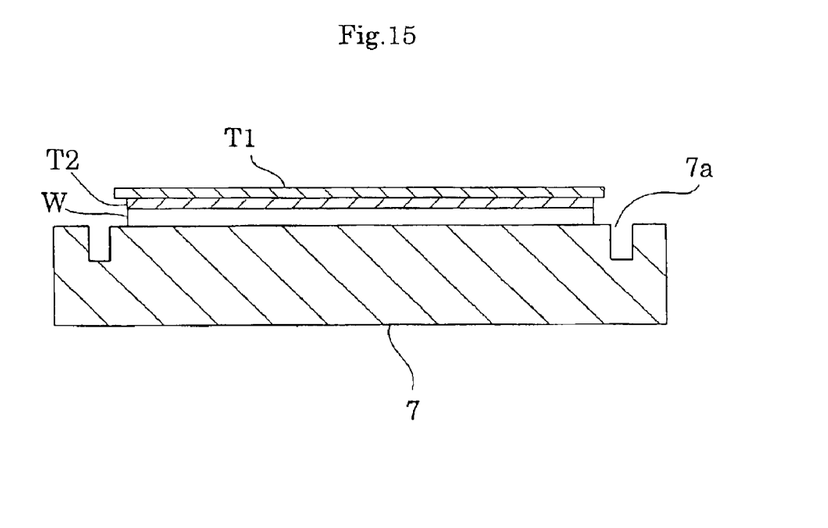
FIG. 15 is a sectional view showing a wafer with protective tape applied in plies thereto in a modified embodiment.

When protective tapes in sheet form are fed over the wafer W and applied thereto, as shown in FIG. 15, a protective tape of smaller diameter than the wafer W may be applied first, and a protective tape of larger diameter than the wafer W as a second tape.

When two protective tapes overlapping like labels are applied to the surface of wafer W, only the first protective tape may be larger in diameter than the wafer W, or only the second protective tape may be larger in diameter than the wafer W. The two protective tapes may be larger in diameter than the wafer W.

(2) The above embodiment has been described, taking a back grinding process for an example of thinning the wafer W. A polishing method (CMP) and etching method are also applicable.

(3) In the above embodiment, the protective tape is removed after preparing a wafer mount frame. The protective tape may be separated after processing the back surface of wafer W.

Figure 16:
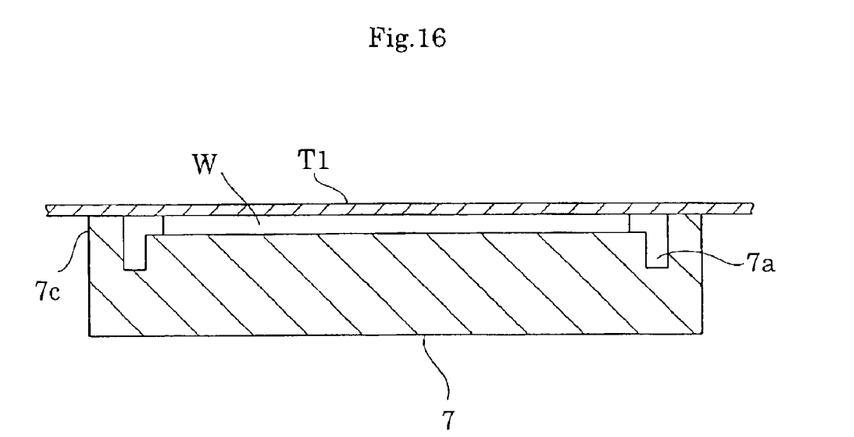
FIG. 16 is a sectional view showing a chuck table in a modified embodiment.

(4) In the above embodiment, the protective tape is applied to the surface of the wafer, and the cutter unit 10 cuts the protective tape while the tape applying mechanism 8 and tape separating mechanism 11 apply tension to the protective tape. The protective tape may be cut by using a chuck table 7 as shown in FIG. 16. Specifically, the chuck table 7 may have a peripheral portion 7c at the same height as a wafer W placed on the chuck table 7, the protective tape T1 being applied level over the peripheral portion 7c and wafer W. The blade tip may be moved along the groove 7a to cut the protective tape.

This invention may be embodied in other specific forms without departing from the spirit or essential attributes thereof and, accordingly, reference should be made to the appended claims, rather than to the foregoing specification, as indicating the scope of the invention.

What is claimed is:

1. A protective tape applying method for applying protective tape to a surface of a semiconductor wafer with a pattern formed thereon, comprising:

a step of applying a first protective tape onto the surface of the semiconductor wafer and a second protective tape onto the first protective tape before processing a back surface of said semiconductor wafer to reduce a thickness thereof, wherein said first and second protective tapes are applied in plies by repeating an operation to cut each protective tape in sheet form fed toward the semiconductor wafer approximately to a shape of the semiconductor wafer, said first protective tape being applied first has a smaller diameter than the semiconductor wafer before the thinning process, and said second protective tape has a larger diameter than the semiconductor wafer before the thinning process.

2. A protective tape applying method for applying protective tape to a surface of a semiconductor wafer with a pattern formed thereon, comprising:

a step of applying a plurality of protective tapes of larger diameter than said semiconductor wafer to the surface of the semiconductor wafer before processing a back surface of said semiconductor wafer to reduce a thickness thereof, wherein said plurality of protective tapes are larger in diameter than the semiconductor wafer before a thinning process, said plurality of said protective tapes is used in a plurality of sheets which are applied in plies to the surface of said semiconductor wafer, said protective tapes are applied in plies by repeating an operation to cut each protective tape in sheet form fed toward the semiconductor wafer approximately to a shape of the semiconductor wafer, and apply the tape to the semiconductor wafer and said protective tapes applied in plies are equal in diameter relative to each other and larger than the semiconductor wafer before the thinning process.

3. A protective tape applying method for applying protective tape to a surface of a semiconductor wafer with a pattern formed thereon, comprising:

a step of applying a first protective tape onto the surface of the semiconductor wafer and a second protective tape onto the first protective tape before processing a back surface of said semiconductor wafer to reduce a thickness thereof, wherein said first and second protective tapes being applied in plies are in form of labels cut approximately to a shape of the semiconductor wafer in advance and said first protective tape being applied first has a smaller diameter than the semiconductor wafer before the thinning process, and said second protective tape has a larger diameter than the semiconductor wafer before the thinning process.

4. A protective tape applying method for applying protective tape to a surface of a semiconductor wafer with a pattern formed thereon, comprising:

a step of applying a first protective tape onto the surface of the semiconductor wafer and a second protective tape onto the first protective tape before processing a back surface of said semiconductor wafer to reduce a thickness thereof, wherein said first and second protective tapes in form of labels are applied in plies such that said first protective tape being applied first has a larger diameter than the semiconductor wafer before the thinning process, and said second protective tape has a smaller diameter than the semiconductor wafer before the thinning process.

5. A protective tape applying method for applying protective tape to a surface of a semiconductor wafer with a pattern formed thereon, comprising:

a step of applying a plurality of protective tapes of larger diameter than said semiconductor wafer to the surface of the semiconductor wafer before processing a back surface of said semiconductor wafer to reduce a thickness thereof, wherein said plurality of protective tapes are larger in diameter than the semiconductor wafer before a thinning process, said plurality of said protective tapes is used in a plurality of sheets which are applied in plies to the surface of said semiconductor wafer, said protective tapes applied in plies are in a form of labels cut approximately to a shape of the semiconductor wafer in advance and said protective tapes in form of labels applied in plies are equal in diameter relative to each other and are larger than the semiconductor wafer before the thinning process.

* * * * *